United States Patent [19]
Stecher et al.

[11] Patent Number: 6,043,531
[45] Date of Patent: Mar. 28, 2000

[54] METHOD FOR PRODUCING BRIDGED, DOPED ZONES

[75] Inventors: Matthias Stecher, Villach, Austria; Tim Gutheit, München; Werner Schwetlick, Gröebenzell, both of Germany

[73] Assignee: Siemens Aktiengesellschaft, Munich, Germany

[21] Appl. No.: 09/035,385

[22] Filed: Mar. 5, 1998

[30] Foreign Application Priority Data

Mar. 5, 1997 [DE] Germany ................ 197 09 002

[51] Int. Cl.$^7$ .............................. H01L 29/78; H01L 29/41
[52] U.S. Cl. ..................... 257/328; 257/341; 257/333; 257/335; 257/509
[58] Field of Search ................................. 257/328, 333, 257/335, 509, 341

[56] References Cited

U.S. PATENT DOCUMENTS

| | | | |
|---|---|---|---|
| 5,237,194 | 8/1993 | Takahashi | 257/467 |
| 5,548,147 | 8/1996 | Mei | 257/333 |
| 5,719,421 | 2/1998 | Hutter | 257/335 |

OTHER PUBLICATIONS

Schade: Mikroelektroniktechnologie; Verlag Technik Berlin, 1991, pp. 430–431.

*Primary Examiner*—Jerome Jackson, Jr.
*Attorney, Agent, or Firm*—Herbert L. Lerner; Laurence A. Greenberg; Werner H. Stemer

[57] ABSTRACT

Bridged, doped zones are formed in a semiconductor. A silicon nitride layer is deposited and structured on a semiconductor region with a predetermined dopant concentration. The structure is subjected to thermal oxidation, with the result that at least one oxide region and at least two oxide-free regions, which are separated from one another by the oxide region, are produced on the surface of the semiconductor region. A dopant is introduced into the oxide-free regions and driven into the semiconductor region. A coherent zone is thus produced in the semiconductor region with a dopant concentration at least ten times the dopant concentration of the semiconductor region. This produces a coherent zone having a high dopant concentration which is bridged by the oxide region which separates the oxide-free regions on the surface of the semiconductor region. Conductive layers, such as a polysilicon layer or a metal layer, for example, can be formed on the oxide region (oxide bridge), with the assurance the conductive layer is completely insulated from the doped zone.

8 Claims, 6 Drawing Sheets

METHOD FOR PRODUCING BRIDGED, DOPED ZONES

BACKGROUND OF THE INVENTION

FIELD OF THE INVENTION

The invention relates to semiconductor manufacture and, more particularly, to a method for producing bridged, doped zones.

A problem that repeatedly arises in integrated semiconductor products is that conductor tracks have to be routed via a doped zone in the semiconductor. DMOS transistors, for example, frequently have an annular deep diffusion zone which functions as a drain terminal and completely surrounds the source and/or gate regions of the DMOS transistor. In order, then, to enable driving the DMOS transistor, it is necessary to route a conductive connection via the annular deep diffusion zone to the gate electrodes. In this case, it is imperative for the function of the DMOS transistor that the conductive connection and the deep diffusion zone be completely insulated from one another. The insulation is usually provided by a silicon oxide layer of sufficient thickness.

For process engineering reasons, however, it is not always possible in the conventional processes to provide a silicon oxide layer which has a sufficient thickness for the proper insulation. If one nevertheless wished to produce a conductive connection across the doped zone in such a situation, one would have to move to a higher metalization plane, since this higher metalization plane is separated from the doped zone by at least one further insulation layer. One of the negative consequence of this move to a higher metalization plane, however, is that additional vias to the higher metalization plane have to be provided.

SUMMARY OF THE INVENTION

It is accordingly an object of the invention to provide a process for producing bridged, doped zones, which overcomes the above-mentioned disadvantages of the prior art devices and methods of this general type and which leads to bridged, doped zones that render the noted move to higher metalization planes unnecessary.

With the foregoing and other objects in view there is provided, in accordance with the invention, a method of producing bridged, doped zones in a semiconductor. The method comprises the following steps:

depositing and structuring a silicon nitride layer on a surface of a semiconductor region with a predetermined dopant concentration;

thermally oxidizing and forming at least one oxide region and at least two dopant regions, separated from one another by the oxide region, on the surface of the semiconductor region; and introducing a dopant into the dopant regions on the surface of the semiconductor region and driving the dopant into the semiconductor region for producing a coherent zone in the semiconductor region with a dopant concentration more than ten times greater than the predetermined dopant concentration of the semiconductor region.

These process steps result in a coherent zone having a high dopant concentration which is bridged by the oxide region that separates the dopant regions on the surface of the semiconductor region. Conductive layers, such as a polysilicon layer or a metal layer, for example, can be extended on this oxide region (oxide bridge). Complete insulation of the conductive layer from the doped zone is ensured.

The concentration of the dopant in the doped zone directly underneath the oxide bridge is somewhat lower than the concentration of the dopant directly underneath the dopant regions. However, the quantity of dopant used and the process parameters used during the introduction and driving in of the dopant are chosen in such a way that a coherent, doped zone is produced within which the dopant concentration at any point is greater than ten times the dopant concentration of the surrounding semiconductor region.

With the above and other objects in view there is also provided a further variant of the novel process which comprises the following steps:

depositing and structuring a silicon nitride layer on a surface of a semiconductor region with a predetermined dopant concentration;

introducing a dopant into a nitride-free region on the surface of the semiconductor region; and producing at least one oxide region and driving the dopant into the semiconductor region by thermal oxidation, for forming at least two dopant regions separated from one another by the oxide region on the surface of the semiconductor region, and for producing a coherent zone in the semiconductor region with a dopant concentration more than ten times greater than the predetermined dopant concentration of the semiconductor region.

As compared to the first above-mentioned method, the latter alternative has the advantage that overall a lower temperature budget (fewer thermic processes) is necessary in order to produce bridged, doped zones. The first-mentioned method, however, has the advantage over the further method that the process parameters required for driving in the dopant can be chosen independently of the process parameters for producing the oxide regions. As a result, very narrowly bounded coherent zones can be formed, thereby making it possible to attain a very high integration level. In the further method, on the other hand, the dopant diffuses out to a greater extent since the thermal loading for producing the oxide regions, which is simultaneously used for driving in the dopant, is usually greater than the thermal loading which has to be used purely for driving in dopant.

In accordance with an added feature of the invention, a silicon oxide layer is formed on the semiconductor region prior to the depositing step.

In accordance with an additional feature of the invention, the silicon nitride layer is removed subsequently to the thermal oxidation step.

In accordance with another feature of the invention, the dopant concentration of the coherent zone is adjusted to more than one hundred times the predetermined dopant concentration of the semiconductor region. In a preferred embodiment, the dopant concentration at every point in the coherent zone is greater than 0.1%, preferably 10%, of a maximum value of the dopant concentration in the coherent zone.

With the above and other objects in view there is provided, in accordance with the invention, a semiconductor product, which is produced as outlined above. The product comprises:

a semiconductor having a semiconductor region formed therein with a predetermined dopant concentration, the semiconductor region having a predetermined dopant concentration;

at least two dopant regions, and an oxide region disposed between and separating the dopant regions from one another, on a surface of the semiconductor region; and a coherent zone formed in the surface of the semiconductor region, the coherent zone connecting the dopant regions, the coherent zone having a dopant concentration more than ten times greater than the predetermined dopant concentration of the semiconductor region.

In a preferred embodiment, the coherent zone is an annular zone.

In the semiconductor product as outlined above the preferred oxide region is a LOCOS oxide region.

In accordance with concomitant feature of the invention, one of the dopant regions is T-shaped or one further dopant region is provided that it is essentially parallel to the dopant regions and adjacent to the oxide bridge. In this way, the effect whereby the dopant concentration underneath the oxide bridge is lower than that underneath the dopant regions can be compensated for by the formation of a thickened portion of the coherent zone in the vicinity of the oxide bridge.

Other features which are considered as characteristic for the invention are set forth in the appended claims.

Although the invention is illustrated and described herein as embodied in a method for producing bridged, doped zones, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
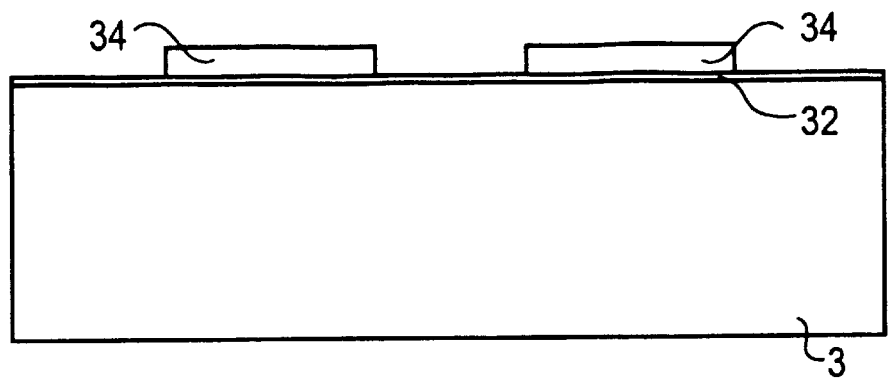
FIGS. 1–3 are diagrammatic elevational views illustrating a first process according to the invention.

Referring now to the figures of the drawing in detail and first, particularly, to FIG. 1 thereof, there is seen a thin silicon oxide layer 32 applied to a weakly doped semiconductor region 3. A silicon nitride layer 34 ($Si_3N_4$) is then deposited on the thin silicon oxide layer 32 and structured. The thin SiO layer below the nitride has the function of keeping the severe mechanical stresses exerted by the nitride away from the silicon of the semiconductor region 3.

Figure 2:
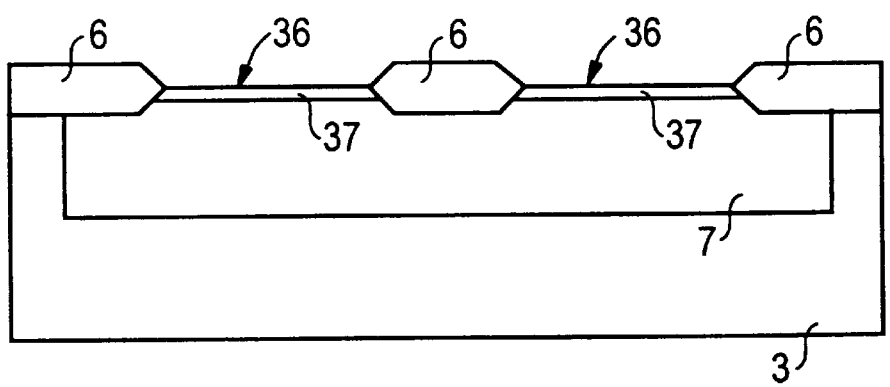
Figure 3:
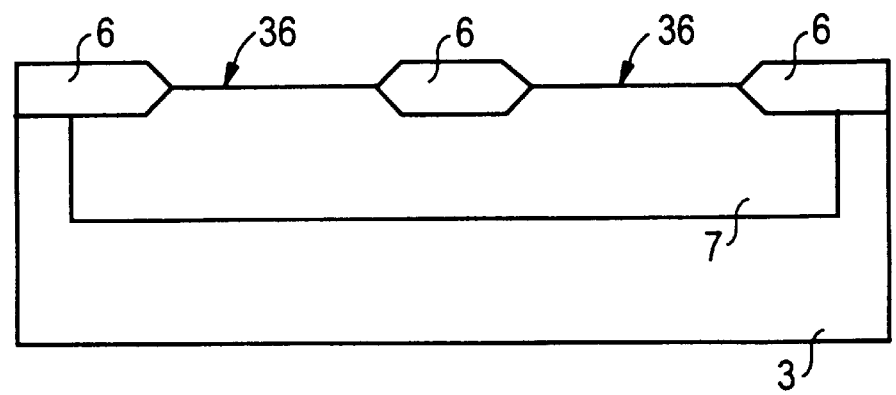

Referring now to FIG. 2, silicon oxide regions 6 are next produced by thermal oxidation, at those points where a silicon nitride layer 34 is not present. Dopant regions 36 remain on the surface of the semiconductor region 3 between the silicon oxide regions 6. Afterwards, both the silicon nitride layer 34 and the thin silicon oxide layer 32 still remaining are removed and a dopant 37 is introduced into the dopant regions 36. The dopant 37 is preferably introduced by furnace coating. However, the dopant 37 can also be implanted into the dopant regions 36. The resulting configuration following the introduction of the dopant 37 is illustrated in FIG. 2.

The dopant 37 is then driven into the semiconductor region 3. This produces a coherent zone 7 with a high dopant concentration which is bridged by one of the oxide regions 6. Conductive layers, such as a polysilicon layer or a metal layer, for example, can be routed via this oxide region 6 (oxide bridge 30; see also FIG. 8). Complete insulation of the conductive layer from the doped zone 7 is thus ensured.

The concentration of the dopant in the doped zone 7 directly underneath the oxide bridge 6 is somewhat lower than the concentration of the dopant directly underneath the dopant regions 36. However, the quantity of dopant used and the process parameters used during the introduction and driving in of the dopant are chosen in such a way that a coherent, doped zone 7 is produced within which the dopant concentration at any point is greater than ten times, preferably greater than one hundred times, the dopant concentration of the surrounding semiconductor region 3.

Figure 4:
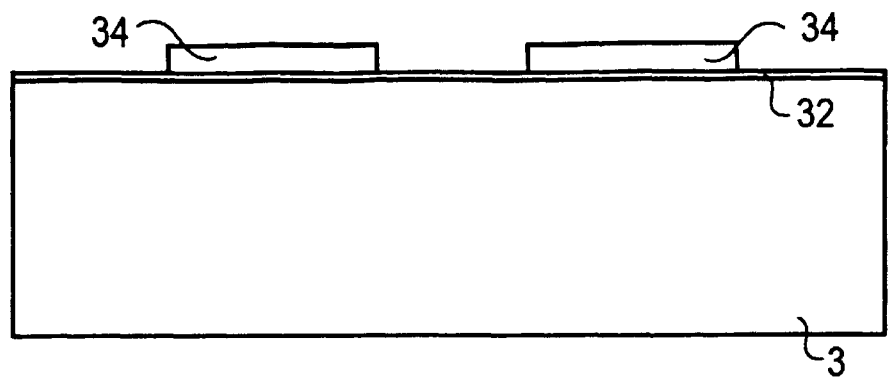
FIGS. 4–6 is a series of similar view illustrating a second process according to the invention.
Figure 5:
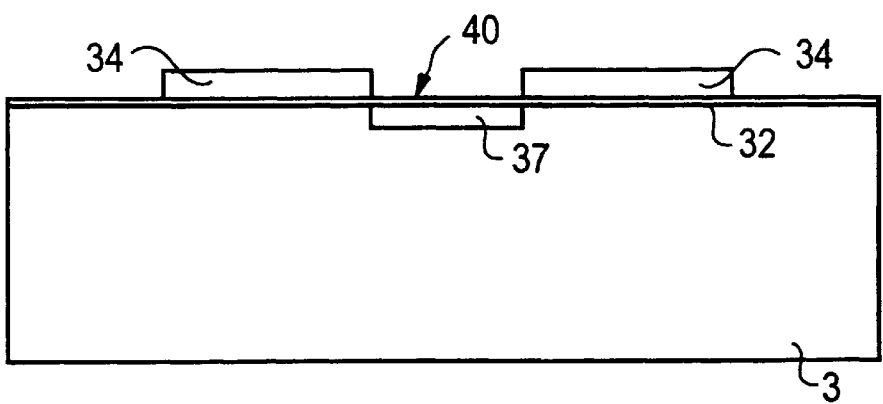
Figure 6:
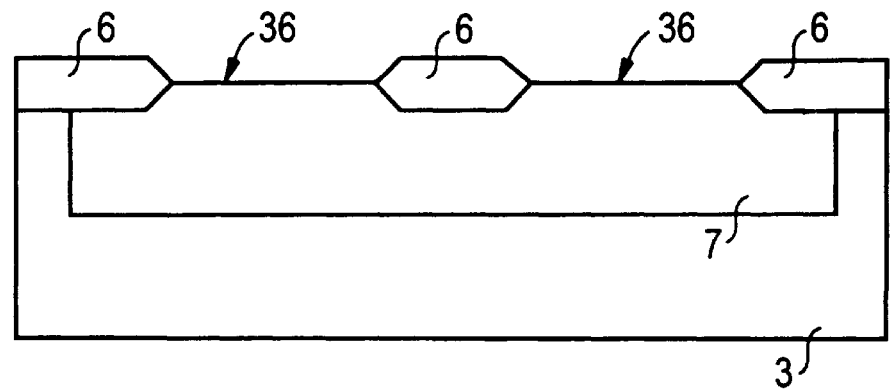

Reference is now had to FIGS. 4–6. Similarly to the first-described process, a thin silicon oxide layer 32 is formed on a weakly doped semiconductor region 3. A silicon nitride layer 34 ($Si_3N_4$) is then deposited on this thin silicon oxide layer 32 and structured. The thin SiO layer under the nitride has the function of keeping the severe mechanical stresses exerted by the nitride away from the silicon of the semiconductor region 3. The configuration resulting from the just-described process is illustrated in FIG. 4.

With reference to FIG. 5, dopant 37 is subsequently introduced into a nitride-free region 40. The dopant 37 is preferably introduced by furnace coating. However, the dopant 37 can also be implanted into the nitride-free region.

Silicon oxide regions 6 are then produced, by means of thermal oxidation, at those points where a silicon nitride layer 34 is not present. At the same time, the dopant 37 is thereby driven into the semiconductor region 3. A coherent zone 7 having a high dopant concentration which is bridged by one of the oxide regions 6 is produced. Furthermore, dopant regions 36 are produced on the surface of the semiconductor region 3 between the silicon oxide regions 6. Finally, both the silicon nitride layer 34 and the still remaining thin silicon oxide layer 32 are removed.

Conductive layers, such as a polysilicon layer or a metal layer, for example, can be routed via the middle oxide region 6 (oxide bridge 30, see also FIG. 8), complete insulation of the conductive layer from the doped zone 7 being ensured.

Figure 7:
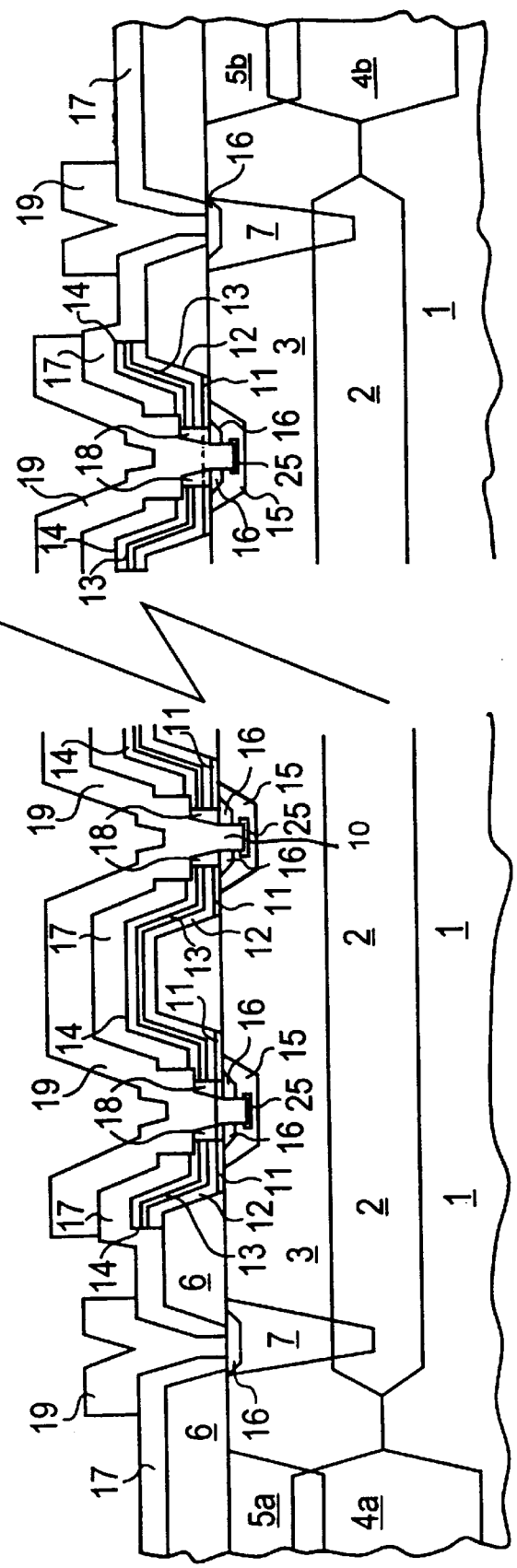
FIG. 7 is a diagrammatic vertical sectional view of a DMOS transistor configuration produced by a method according to the invention.

Reference will now be had to FIG. 7, which shows an application of the novel process in a DMOS transistor configuration. An n-doped well 3 (semiconductor region 3) is formed, for instance epitaxially, over a semiconductor material 1 with boron doping and any desired orientation. Low-impedance contact is made with the well 3 by a zone 2 of high conductivity. The well is insulated by p-doped regions 4a, 4b and also 5a and 5b each having high conductivity. The low-impedance well terminal 2 is connected to the surface of the well 3 by a deep diffusion zone 7 (coherent zone 7) of high conductivity. The entire configuration is insulated from other components by an insulation layer 6. The deep diffusion zone 7 and also the insulation layer 6 have been produced by one of the methods according to the invention.

The insulation layer 6 has in this case been structured in such a way that oxide bridges 30 (see FIG. 8) are provided over the deep diffusion zone 7 annularly enclosing the DMOS transistor configuration. A semiconductor layer 12 has been deposited over the bridges in a later method step.

The next step saw the production of an insulating layer 11, for example as thermally produced silicon oxide. This layer fulfills the function of gate insulation. Afterwards, a semiconductor layer 12, for example a polysilicon layer, was applied. The layer 12 was doped to high conductivity by means of furnace coating. The gate of the DMOS transistor configuration is produced from this layer.

In the next step, a second insulating layer 13, preferably a thermal silicon oxide layer, was applied to the semiconductor layer 12. A further insulating layer 14, preferably a TEOS layer, was then produced on the second insulating layer 13. The double layer 13, 14 comprising the thermal oxide 13 and the TEOS oxide 14 was then structured by means of a standard photographic technique and etched anisotropically.

Using the first insulating layer 13, 14 as a mask, the semiconductor layer 12 was subsequently etched anisotropically. In the next step, a p-doped dopant 15 of average conductivity was implanted into the semiconductor material.

Once the p-doped layer 15 has been driven in, this zone fulfills the function of the body of the DMOS transistor configuration in the exemplary embodiment. The photographic technique used for the implantation was a standard resist photographic technique.

N-doped zones 16 of high conductivity were implanted and driven into the semiconductor material by means of a further standard resist photographic technique. The n-doped zones 16 fulfill the function of the source regions of the DMOS transistor configuration. The driving in of the n-doped layers 16 was followed by the application of a second insulation layer 17. The second insulating layer is preferably a phosphorus- or boron-containing oxide and has a similar thickness to the first insulating layer or to the sum of the double layers 13 and 14. The second insulating layer may be, for example, a borophosphorus silicate glass layer. The layer 17 may then be compressed in a furnace process, wherein the layer should not flow to a great extent.

The second insulating layer was then structured with the aid of a further photographic technique and anisotropic etching down to the semiconductor surface. This means that the etching step stops at the semiconductor surface. The semiconductor material was then etched using the structure of the layer 17 produced in this way as a mask in the region of the contact to be produced. The resulting trench 10 is at a fixed distance from the structured semiconductor layer 12, that is to say from the polysilicon edge, on account of the spacer 18 formed by the layer 17.

Afterwards, a p-doping 25 having a high dose was implanted as third dopant into the semiconductor material, that is to say into the bottom of the silicon trench produced. The function of this step is to reduce the contact resistances. The masking in this step was once again effected by the second insulating layer 17. In the next step, a metalization layer 19, made of aluminum, for example, was applied over the whole area and structured. The function of this layer is to contact the semiconductor material or it has the function of a conductive track. The resulting configuration is shown in FIG. 7.

A plurality of gate regions 11 are provided in the transistor configuration shown in FIG. 7 in order to ensure that a predetermined current which is as large as possible can be switched. In order to enable a structure of the gate region which saves as much space as possible, the gate regions are arranged regularly over a predetermined area, as is evident from FIG. 8. The arrangement of the gate regions is in this case completely surrounded by the deep diffusion zone 7.

Figure 8:
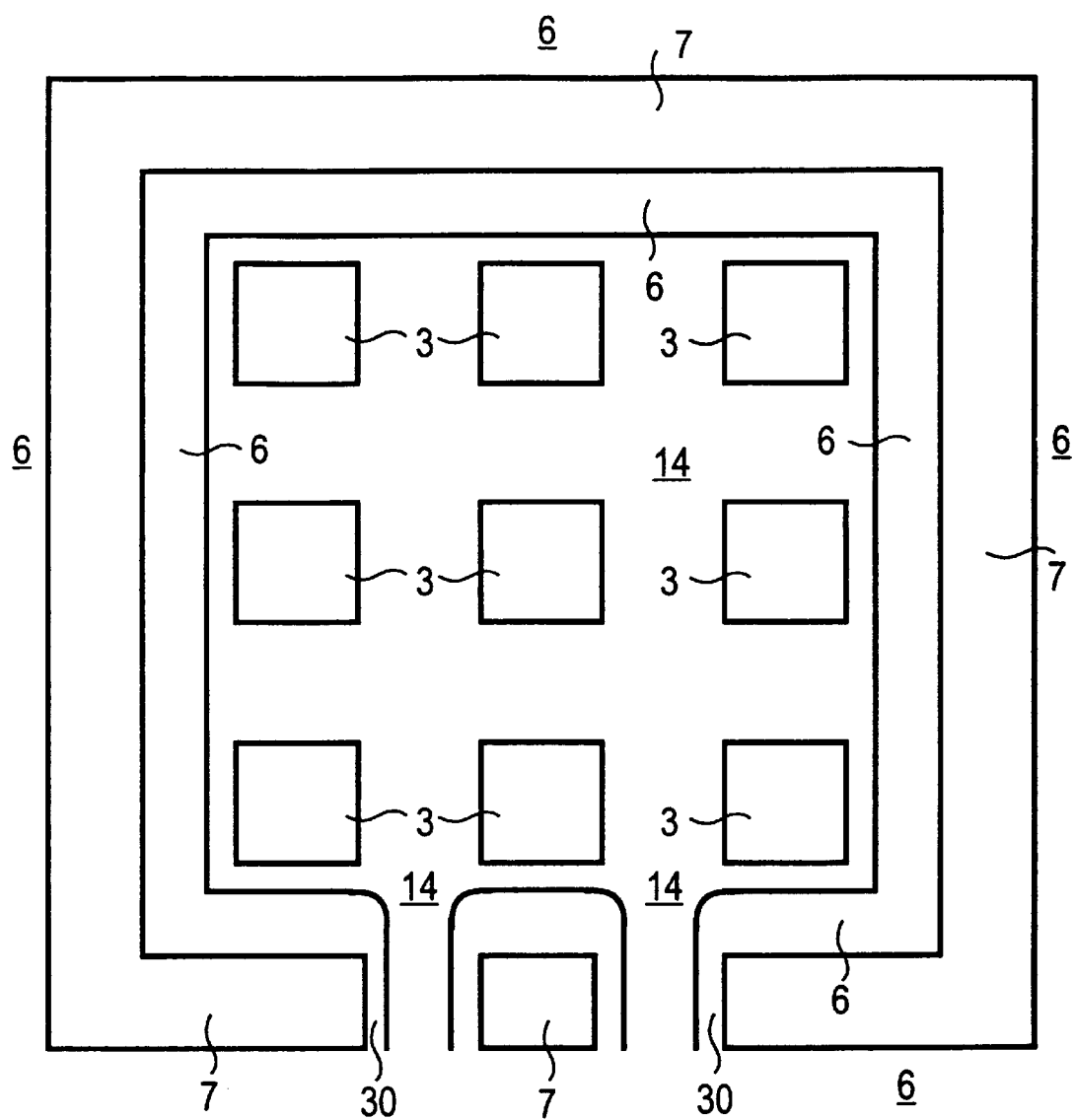
FIGS. 8–10 are various diagrammatic plan views of DMOS transistor configurations according to the invention.

For reasons of clarity, FIG. 8 shows the DMOS transistor configuration in the production phase after the semiconductor layer 12 and also the insulating layers 13 and 14 have been applied and structured but before the second insulating layer 17 and also the metalization layer 19 have been applied and structured.

In order that the current through the transistor configuration can be controlled, a voltage must be applied externally to the semiconductor layer 12 (gate electrode). Therefore the semiconductor layer is extended via the deep diffusion zone 7 on one side of the transistor configuration. In order to ensure reliable functioning of the transistor configuration, the deep diffusion zone 7 and the semiconductor layer 12 must be completely insulated from one another. For this reason, the deep diffusion zone 7 and the insulation layer 6 in the DMOS transistor configuration have been produced by the method according to the invention, with the result that oxide bridges 30 are provided from the insulation layer 6. The bridges extend over the deep diffusion zone 7 and the semiconductor layer 12 extends over the bridges. The oxide bridges 30 from the insulation layer 6 have a sufficient thickness to ensure reliable insulation of the semiconductor layer 12 from the deep diffusion zone 7. It is thus possible to avoid moving to a higher metalization plane for the connection of the gate electrodes.

The deep diffusion zone 7 (coherent zone 7) is intended to reduce in particular negative effects which might be produced by a parasitic pnp transistor (p-doped layer 15, n-doped semiconductor region 3, p-doped regions 4a, 4b and also 5a and 5b). In order to ensure the effect of the deep diffusion zone 7 wherever the dopant concentration within the deep diffusion zone 7 is lower on account of the oxide bridges 30, the deep diffusion zone 7 can be made thicker at these points.

Figure 9:
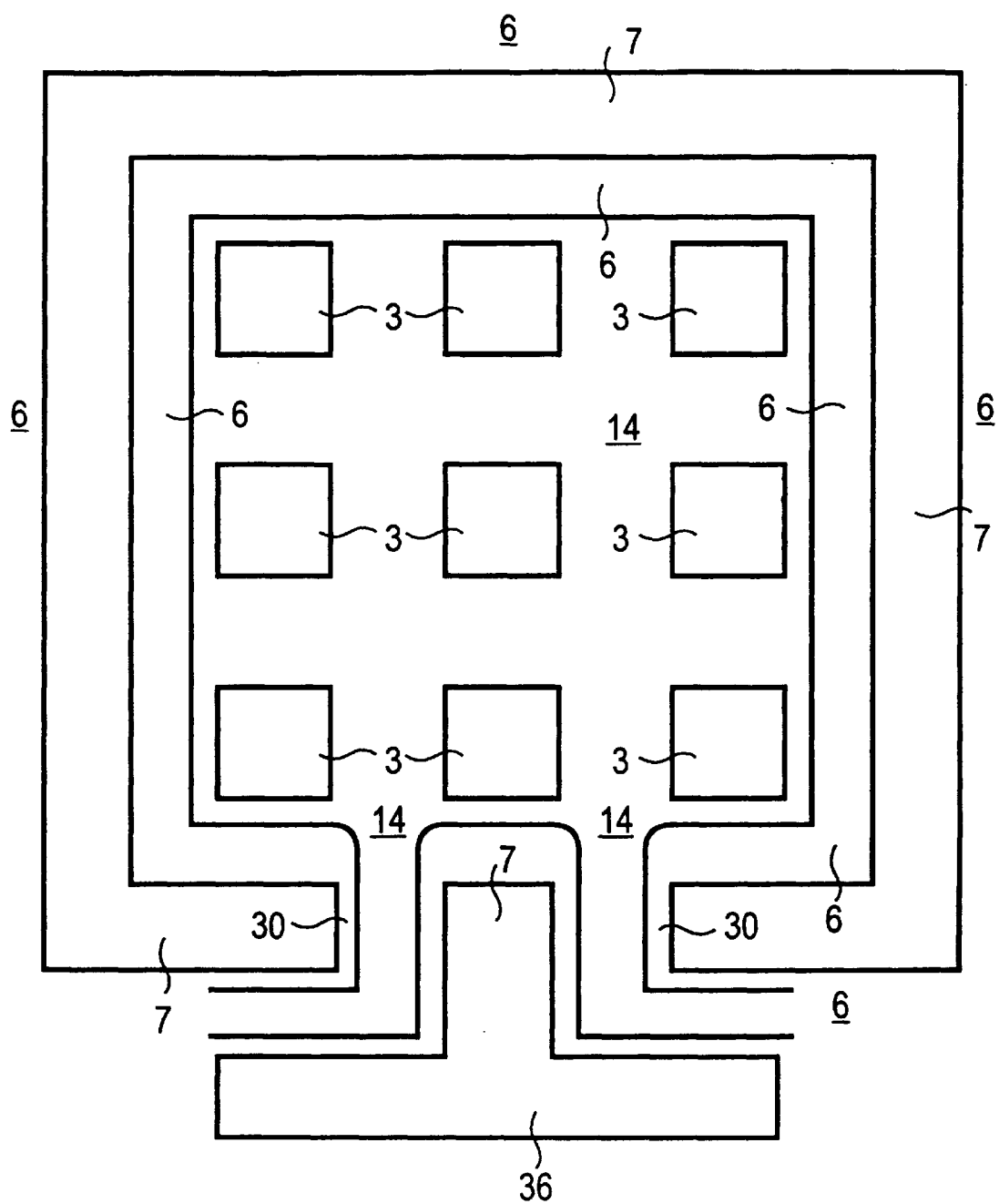
Figure 10:
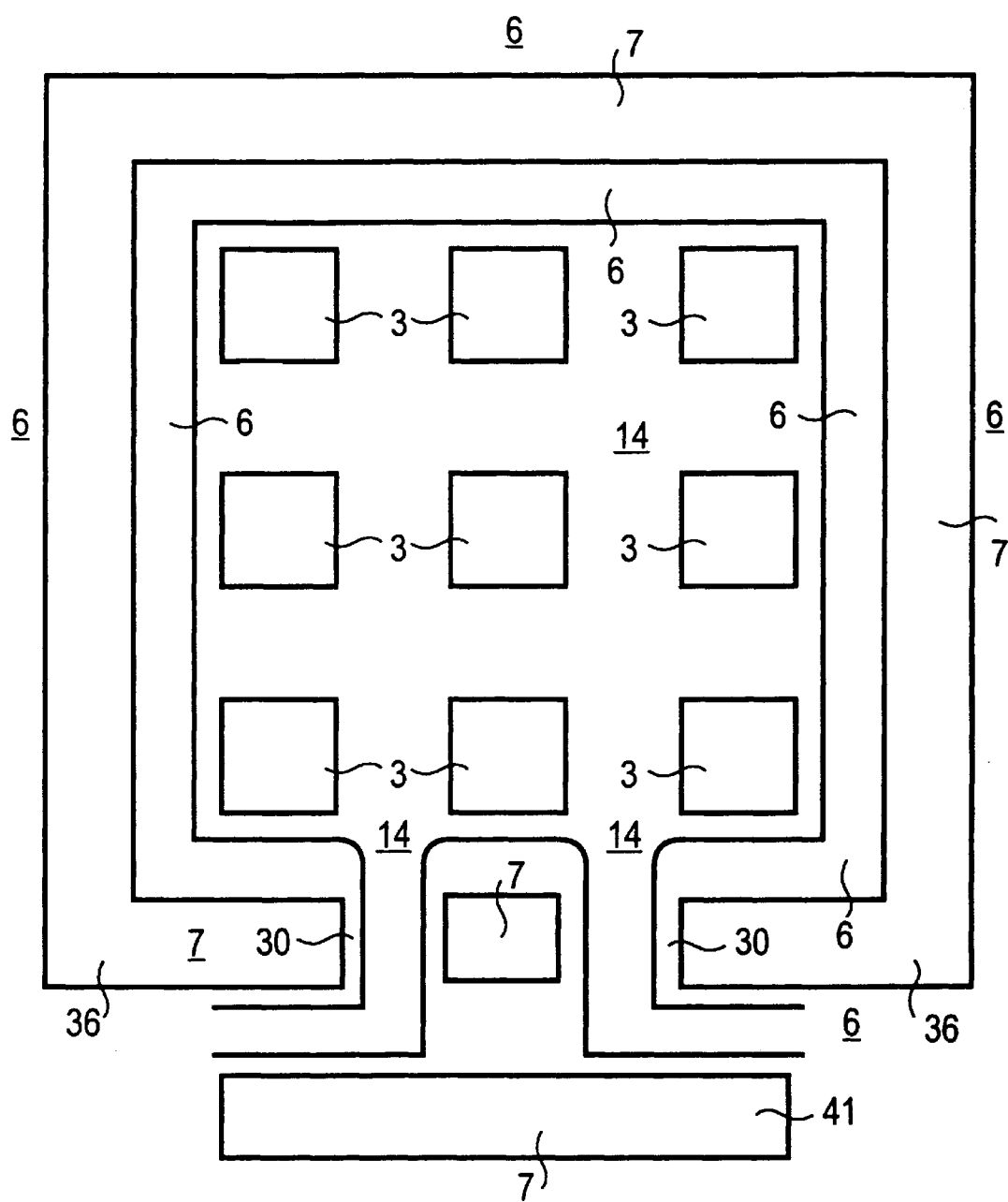

The middle dopant region 36 is therefore T-shaped in FIG. 9. This produces a deep diffusion zone 7 which is widened in the lateral direction. Instead of a T-shaped dopant region 36, it is also possible for an additional dopant region 41 to be designed such that it is essentially parallel to the dopant regions 36 and adjacent to the oxide bridges 30, FIG. 10. Also possible are two additional dopant regions which are arranged parallel and offset to the dopant regions 36, so that the semiconductor layer 12 has to wind through between the various dopant regions.

We claim:

1. A semiconductor product, comprising:
   a semiconductor having a surface, a buried conductive zone formed in said semiconductor, and a semiconductor region formed in said semiconductor with a predetermined dopant concentration;
   at least two dopant regions each having the same conductivity type and an oxide region disposed between and separating said at least two dopant regions from one another on a surface of said semiconductor region;
   a coherent zone formed said surface of said semiconductor region, connected to said buried conductive zone and having the same conductivity type as said at least two dopant regions, said coherent zone connecting said dopant regions, said coherent zone having a dopant concentration more than ten times greater than the predetermined dopant concentration of said semiconductor region; and
   a conductive layer formed on said oxide region.

2. The semiconductor product according to claim 1, wherein said oxide region is a LOCOS oxide region.

3. The semiconductor product according to claim 1, wherein the dopant concentration of said coherent zone is more than one hundred times greater than the predetermined dopant concentration of said semiconductor region.

4. The semiconductor product according to claim 1, wherein the dopant concentration at every point in said coherent zone is greater than 0.1% of a maximum value of the dopant concentration in the coherent zone.

5. The semiconductor product according to claim 1, wherein the dopant concentration at every point in said coherent zone is greater than 10% of a maximum value of the dopant concentration in the coherent zone.

6. The semiconductor product according to claim 1, wherein said coherent zone is an annular zone.

7. The semiconductor product according to claim 1, wherein one of said dopant regions is a T-shaped region.

8. The semiconductor product according to claim 1, which comprises at least one further dopant region disposed substantially parallel to said at least two dopant regions and adjacent a oxide bridge between said at least two dopant regions and said further dopant region.

* * * * *